(12) United States Patent
Pierreux et al.

(10) Patent No.: US 12,077,854 B2
(45) Date of Patent: Sep. 3, 2024

(54) CHEMICAL VAPOR DEPOSITION FURNACE WITH A CLEANING GAS SYSTEM TO PROVIDE A CLEANING GAS

(71) Applicant: ASM IP Holding, B.V., Almere (NL)

(72) Inventors: Dieter Pierreux, Pepingen (BE); Theodorus G. M. Oosterlaken, Oudewater (NL); Herbert Terhorst, Amersfoort (NL); Lucian Jdira, Nieuw Vennep (NL); Bert Jongbloed, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 3 days.

(21) Appl. No.: 17/810,773

(22) Filed: Jul. 5, 2022

(65) Prior Publication Data
US 2023/0008131 A1 Jan. 12, 2023

Related U.S. Application Data

(60) Provisional application No. 63/218,604, filed on Jul. 6, 2021.

(51) Int. Cl.
| | | |
|---|---|---|
| *C23C 16/44* | (2006.01) | |
| *C23C 16/34* | (2006.01) | |
| *C23C 16/455* | (2006.01) | |
| *C23C 16/458* | (2006.01) | |
| *C23C 16/52* | (2006.01) | |

(52) U.S. Cl.
CPC ........ *C23C 16/4405* (2013.01); *C23C 16/345* (2013.01); *C23C 16/455* (2013.01); *C23C 16/45561* (2013.01); *C23C 16/4583* (2013.01); *C23C 16/52* (2013.01)

(58) Field of Classification Search
CPC ............ C23C 16/4583; C23C 16/4405; C23C 16/345; C23C 16/455; C23C 16/45561
See application file for complete search history.

(56) References Cited

U.S. PATENT DOCUMENTS

| | | | |
|---|---|---|---|
| 2009/0197424 A1* | 8/2009 | Sakai ................ | C23C 16/45546 438/758 |
| 2014/0087568 A1* | 3/2014 | Noda ................ | H01L 21/02277 134/1.1 |

(Continued)

OTHER PUBLICATIONS

Nov. 28, 2022—(EP) Extended Search Report—EP App. 22183082.1.

*Primary Examiner* — Joseph A Miller, Jr.
(74) *Attorney, Agent, or Firm* — Banner & Witcoff, Ltd.

(57) ABSTRACT

A chemical vapor deposition furnace for depositing silicon nitride films is disclosed. The furnace includes a process chamber elongated in a substantially vertical direction and a wafer boat for supporting a plurality of wafers in the process chamber. A process gas injector inside the process chamber is provided with vertically spaced gas injection holes to provide gas introduced at a feed end in an interior of the process gas injector to the process chamber. A valve system connected to the feed end of the process gas injector is being constructed and arranged to connect a source of a silicon precursor and a nitrogen precursor to the feed end for depositing silicon nitride layers. The valve system may connect the feed end of the process gas injector to a cleaning gas system to provide a cleaning gas to remove silicon nitride from the process gas injector and/or the process chamber.

19 Claims, 2 Drawing Sheets

(56) References Cited

U.S. PATENT DOCUMENTS

| | | |
|---|---|---|
| 2015/0099373 A1 | 4/2015 | Sano et al. |
| 2017/0260626 A1* | 9/2017 | Nagato .............. H01L 21/02164 |
| 2019/0283093 A1 | 9/2019 | Son et al. |
| 2019/0330740 A1* | 10/2019 | Klaver .............. H01L 21/67103 |

* cited by examiner

CHEMICAL VAPOR DEPOSITION FURNACE WITH A CLEANING GAS SYSTEM TO PROVIDE A CLEANING GAS

FIELD

The present disclosure relates to the field of semiconductor processing apparatus. More in particular it relates to cleaning a chemical vapor deposition furnace with a cleaning gas.

BACKGROUND

A chemical vapor deposition furnaces for depositing films on wafer may have a process chamber and a wafer boat for supporting a plurality of wafers in the process chamber. A process gas injector may be provided inside the process chamber extending along a wall of the process chamber. The process gas injector may be provided with a plurality of vertically spaced gas injection holes to provide gas introduced in an interior of the process gas injector at a feed end into the process chamber to deposit the films on the wafers.

The films produced by this process not only deposit on the wafer, but also on the process chamber, the wafer boat and the process gas injector. The films may have high tensile stress which may lead to high levels of particle contamination of the wafers from flacking of the film of the reactor, the wafer boat and the process gas injector. The process chamber, wafer boat and process gas injector may be cleaned or replaced before the films start flacking to prevent wafer contamination. For cleaning, an etchant gas may be used to clean the films away. If too much of the etchant gas is provided parts of the process chamber and process gas injector may be over etched which may lead to damaging of those parts. If too less of the etchant gas is provided, parts of the process chamber and process gas injector may still have a film on them.

It has been found that it is difficult to find the right balance in cleaning enough so that the parts are sufficiently cleaned while assuring that the parts are not over etched.

SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

According to an objective there may be provided a chemical vapor deposition furnace with improved cleaning.

According to an embodiment there may be provided a chemical vapor deposition furnace for depositing silicon nitride films on a plurality of wafers. The furnace comprising a process chamber elongated in a substantially vertical direction and a wafer boat for supporting the plurality of wafers in the process chamber. The furnace may have a process gas injector inside the process chamber extending in the substantially vertical direction along the wafer boat and provided with a plurality of vertically spaced gas injection holes to provide gas introduced at a feed end in an interior of the process gas injector to the process chamber. The furnace may be provided with a valve system operably connected to the feed end of the process gas injector and being constructed and arranged to connect a source of a silicon precursor and a source of a nitrogen precursor to the feed end of the process gas injector for depositing silicon nitride layers. The valve system may be constructed and arranged to connect the feed end of the process gas injector to a cleaning gas system to provide a cleaning gas to the interior to remove silicon nitride from the process gas injector and/or the process chamber.

According to a further embodiment there is provided a method for depositing a silicon nitride layer on a plurality of wafers. The method comprising providing a plurality of wafers in a wafer boat and loading the wafer boat in a substantial vertical direction into a process chamber of a chemical vapor deposition furnace, flowing a process gas based on a silicon precursor and a nitrogen precursor into an interior of a process gas injector extending parallel to the wafer boat to a plurality of vertically spaced gas injection holes to provide the process gas to the process chamber over the wafers in the wafer boat to deposit silicon nitride, and removing the plurality of wafers in the wafer boat from the process chamber. The method may comprise providing a cleaning gas to the interior of the process gas injector and from the interior of the process gas injector into the process chamber to remove silicon nitride from the process gas injector and/or the process chamber.

According to still a further embodiment there is provided a method for depositing a silicon nitride layer on a plurality of wafers. The method comprising providing a plurality of wafers in a wafer boat and loading the wafer boat in a substantially vertical direction into a process chamber of a chemical vapor deposition furnace, flowing a process gas based on a silicon precursor and a nitrogen precursor into an interior of a process gas injector extending parallel to the wafer boat to a plurality of vertically spaced gas injection holes to provide the process gas to the process chamber over the wafers in the wafer boat to deposit silicon nitride and removing the plurality of wafers in the wafer boat from the process chamber. The method may comprise providing a cleaning gas to the process gas injector while providing an inert gas to the process chamber, thereby removing silicon nitride from the process gas injector, stopping the provision of the cleaning gas to the process gas injector, and providing the inert gas to the process gas injector while providing the cleaning gas to the process chamber, thereby removing silicon nitride from the process chamber.

The various embodiments of the invention may be applied separate from each other or may be combined. Embodiments of the invention will be further elucidated in the detailed description with reference to some examples shown in the figures.

BRIEF DESCRIPTION OF THE FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF THE FIGURES

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below. The illustrations presented herein are not meant to be actual views of any particular material, structure, or device, but are merely idealized representations that are used to describe embodiments of the disclosure.

As used herein, the term "substrate" or "wafer" may refer to any underlying material or materials that may be used, or upon which, a device, a circuit, or a film may be formed. The term "semiconductor device structure" may refer to any portion of a processed, or partially processed, semiconductor structure that is, includes, or defines at least a portion of an active or passive component of a semiconductor device to be formed on or in a semiconductor substrate. Semiconductor substrates can be processed in batches in vertical furnaces. An example of such processing is the deposition of layers of various materials on the substrates. Some of the process may be based on chlorides and ammonia for example.

Figure 1:
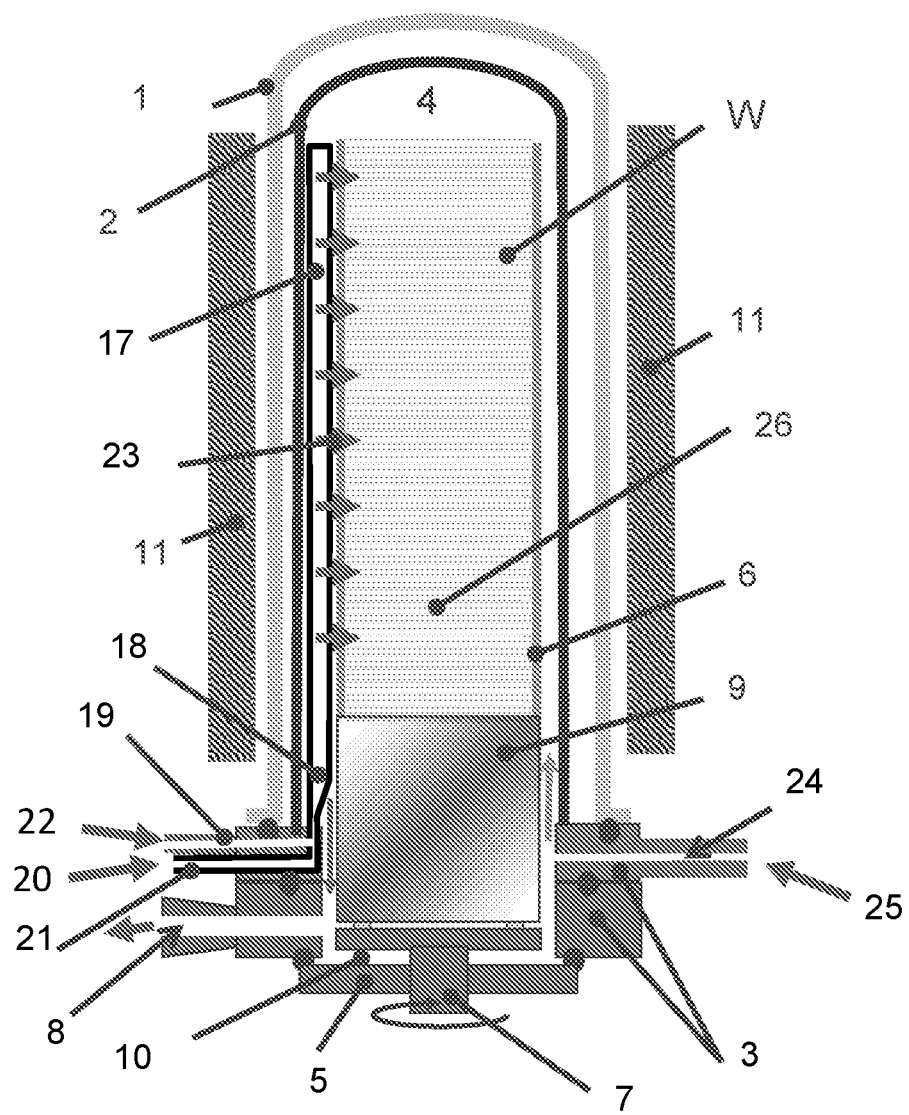
FIG. 1 is a cross sectional side view of an example of a chemical vapor deposition furnace including a process tube.

FIG. 1 is a cross sectional side view of an example of a chemical vapor deposition furnace, including a low pressure process tube 1 defining a low pressure process chamber 4. The furnace may comprise a vertically movable door 5 configured to close off a central inlet opening 10 in lower and/or upper flanges 3 and configured to support a wafer boat 6 that is configured to hold a plurality of substrates. The upper and lower flanges 3 may be partially closing an open end of the process tube 1. A liner 2 may extend along the process tube 1 to protect the tube 1.

The door 5 may be provided with a drive 7 to allow for rotation of the wafer boat 6 in the process chamber 4. In between the drive 7 and the wafer boat 6 a pedestal 9 may be provided. The pedestal 9 may be provided with heaters and/or thermal insulators to improve the heat uniformity for the wafers in the boat 6. The liner 2 may be closed at a higher end for example with a dome shape and may be substantially closed for gases above an opening at the bottom. The lower flanges 3 comprises an inlet opening 10 configured to insert and remove a boat 6 configured to carry a plurality of substrates in the process chamber 4.

A process gas injector 17 may be provided inside the process chamber 4 extending in a substantially vertical direction over substantially a height of the wafer boat 6. The liner 2 extending along the tube 1 may have a radially outwardly extending bulge to accommodate the process gas injector 17. The process gas injector 17 comprises a feed end 18 operationally connected to a first feed line 19 which may be connected to a source of a silicon precursor 20. The feed end 18 may be also operationally connected to a second feed line 21 which may be connected to a source of a nitrogen precursor 22.

The silicon precursor provided at the feed end 18 of the process gas injector may comprise silane. The silicon precursor may comprise one or more compounds chosen from a group consisting of monochlorosilane, dichlorosilane, trichlorosilane, tetrachlorosilane, disilane and trisilane. The nitrogen precursor provided at the feed end 18 of the process gas injector may comprise ammonia.

The nitrogen precursor and the silicon precursor may start to mix and react with each other when they enter the interior of the process gas injector 17 at the feed end 18. The mixing assures good productivity and good uniformity of the deposition process. The flow of process gas through the process gas injector 17 into the process chamber 4 may be between 100 and 500, preferably 250 cubic centimeters per minute (SCCM).

Optionally, the nitrogen precursor and the silicon precursor may be provided sequentially by the valve system 31 to the process chamber 4 in an atomic layer deposition mode. The later giving good possibilities to control the layer thickness.

The process gas injector 17 may be provided with a plurality of vertically spaced gas injection holes 23 to provide gas received in the interior of the injector 17 at the feed end 18 to the process chamber 4 uniformly over the length of the wafer boat 6. The plurality of gas injection holes may extend over a part of a height of the gas process gas injector 17. The first and second feed lines 19, 21 may be provided partially as a passage through one of the flanges 3 and further as a tube to a source of the nitrogen precursor 22 or the silicon precursor 20.

The plurality of gas injection holes may extend over a part of a height of the process gas injector 17. The gas injection holes 23 each may have a gas injection hole diameter of at least about 1 mm. The diameter of the gas injection holes may for example be about 3 mm. All gas injection hole diameters of the process gas injector 17 may be substantially equal. Each gas injection hole may have a gas injection hole area, wherein an aggregate area of all the gas injection hole areas of the process gas injector 17 may be at least about 30 $mm^2$. The aggregate area of all the gas injection hole areas may be between about 200 $mm^2$ and 400 $mm^2$.

The chemical vapor deposition furnace may be provided with a purge gas injection system comprising a purge line 24 to provide a purge gas 25 into the process chamber 4 near a lower end of the process chamber 4. The purge line 24 may be provided partially as a passage through one of the flanges 3 and further as a tube to a source of the purge gas 25. The purge injection gas system may be constructed and arranged to provide an inert gas as a purge gas. The purge gas injection system may be constructed and arranged to provide nitrogen as the inert purge gas. Nitrogen is a cheap inert gas which is readily available in a semiconductor fabrication fab.

The purge gas injection system may be constructed and arranged to provide between 15 to 100, preferably 30 to 70 and most preferably around 50 cubic centimeters per minute (SCCM) of purge gas into the process chamber. The purge injection gas system may be constructed and arranged to provide an inert gas as a purge gas in the process chamber to improve the uniformity of the silicon nitride depositions on the wafers over a height over the boat. The purge injection gas system may be provided with a tuning knob to adjust the flow of purge gas in the process chamber to adjust the uniformity of the silicon nitride depositions on the wafers over a height over the boat.

The chemical vapor deposition furnace may be provided with a gas exhaust opening 8 for removing gas at a lower end of the process chamber 4. In this way by closing the liner 2 above the liner opening for gases, providing a process gas with the process gas injector 17 and a purge gas 25 with the purge gas injection system to the process chamber 4 and removing gas from the process chamber 4 by the gas exhaust opening 8 at a lower end of the process chamber 4, a down flow 26 in the process chamber 4 may be created. This down flow may transport contamination of reaction byproducts, particles from the substrates, the boat 6, the liner 2 and/or the support area of the liner 2 on the flange 3 downward and radially outward to the gas exhaust opening 8 away from the processed substrates W. The gas exhaust opening 8 for removing gas from the process chamber 4 may be operationally connected to a pump. The pump may be used to control the pressure in the process chamber 4 to a pressure between 20 and 500, more preferably between 50 to 300 and most preferably between 100 and 150 milliTorr.

The chemical vapor deposition furnace may be used for depositing a silicon nitride layer on a wafer W by: providing a plurality of wafers in a wafer boat 6 and loading the wafer boat in a substantial vertical direction into a process chamber 4 of a chemical vapor deposition furnace; flowing a process gas based on a silicon precursor 20 and a nitrogen precursor 22 into a process gas injector 17 to a plurality of vertically spaced gas injection holes 23 to provide the process gas to the process chamber 4 and over the wafers in the wafer boat 6. Optionally a purge gas 25 and/or a process gas may be provided in the into the process chamber 4 near a lower end of the process chamber 4. The pressure in the process chamber 4 may be controlled to a pressure between 20 and 500, more preferably between 50 to 300 and most preferably between 100 and 150 milliTorr during the deposition process.

The films produced by this deposition process do not only deposit on the wafer, but also on the liner 2 of the process chamber 4, the wafer boat 6 and the interior and exterior of the process gas injector 17. The films may have high tensile stress which may lead to high levels of particle contamination of the wafers from flacking of the film of the reaction chamber 4, the wafer boat 6 and the process gas injector 17. The process chamber 4, wafer boat 6 and process gas injector 17 may be cleaned or replaced before the films start flacking to prevent wafer W contamination.

For cleaning, an etchant gas may be used to clean the films away. If too much of the etchant gas is provided parts of the process chamber and process gas injector may be over etched which may lead to damaging those parts. If too less of the etchant gas is provided parts of the process chamber and process gas injector may still have a film on them. It has been found that it is difficult to find the right balance in cleaning enough so that the parts are sufficiently cleaned while assuring that the parts are not over etched. This has been particularly the case for the interior of the process gas injector 17. The interior of the process gas injector 17 is cleaned because of the high concentration of process gasses especially sensitive to deposition.

Figure 2:
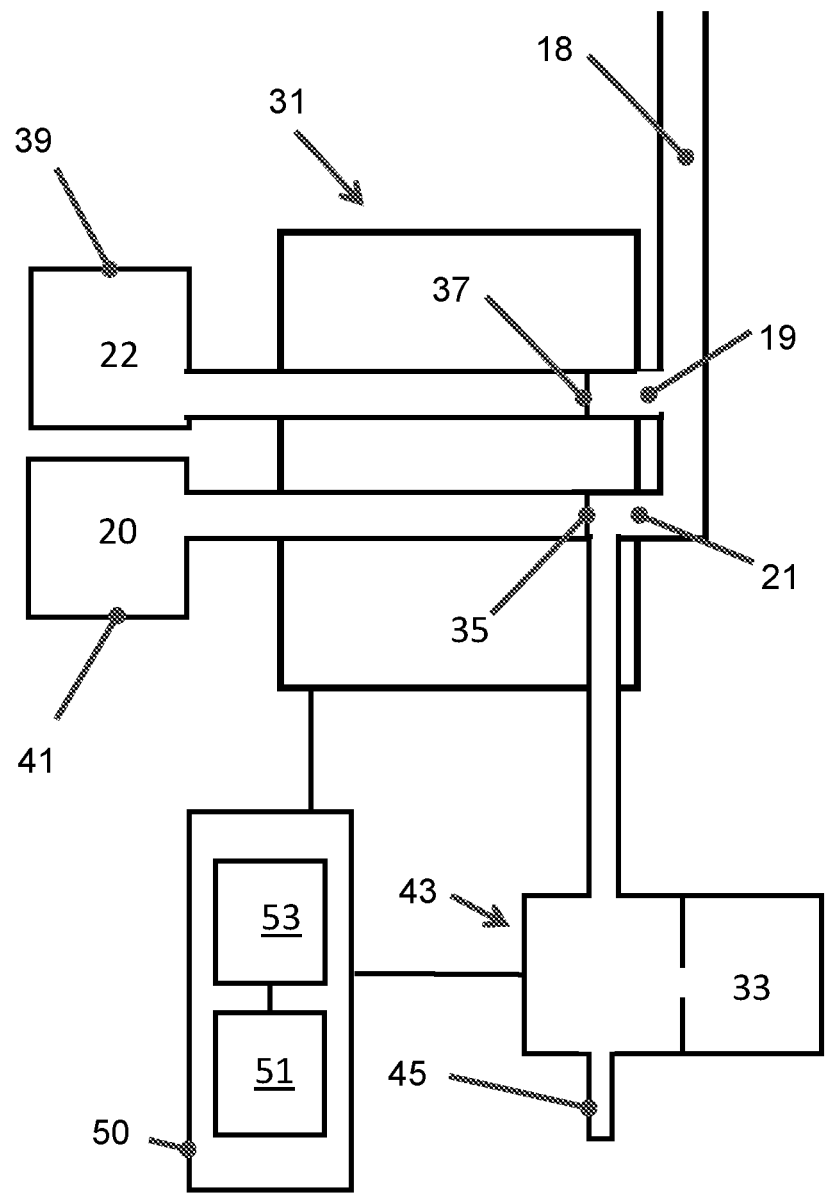
FIG. 2 discloses a valve system, a cleaning gas system and a controller of the chemical vapor deposition furnace of FIG. 1.

FIG. 2 discloses a valve system 31 and a cleaning system 43, 33 for cooperation with the chemical vapor deposition furnace of FIG. 1. FIG. 2 shows the feed end 18 of the process gas injector 17 being connected to a second source 41 of a silicon precursor 20 via the second feed line 21 and a second valve 35. The feed end 18 of the process gas injector 17 may also be connected to a first source 39 of a nitrogen precursor 22 via the first feed line 19 and a second valve 37. As depicted both the first and second valves 35, 37 are closed for silicon precursor 20 and nitrogen precursor 22. However if both the first and second valves 35, 37 are opened for silicon precursor 20 and nitrogen precursor 22 the feed end 18 of the process gas injector 17 will receive process gas for depositing silicon nitride layers in the process chamber 4.

The valve system 31 may be further constructed and arrange arranged to connect the feed end 18 of the process gas injector 17 to a cleaning gas system 43 provided with a cleaning gas source. This may be done by closing the second source 41 of the silicon precursor 20 via the second feed line 21 with the first valve 35 as depicted in FIG. 2. Simultaneously the flow of the nitrogen precursor 22 from the first source 39 via the first feed line 19 to the feed end 18 may be closed by the second valve 37. In this way we may provide a cleaning gas 33 from the cleaning gas system 43 to the interior of the process gas injector 17 to remove silicon nitride there and later when it exits the interior of the process gas injector via the gas injection holes 23 into the process chamber 4 it may clean the process chamber 4. Since the interior of the process gas injector 17 may be the first area which will be provided with fresh cleaning gas 33 the etching rate may be higher in the interior than in the reaction chamber 4. This is advantageous because the deposition rate is also higher in the interior of the process gas injector 17 so we may benefit especially there from the higher etching rate in the interior of the process gas injector 17.

It may be understood that with a source is meant a vessel containing the gas or a gas connection providing the gas. As depicted the first valve 35 may be a two way valve which either connects the silicon precursor or the cleaning gas to the feed end 18. The valve system 31 may also be designed with two valves which perform this function separately.

A controller 50 may be provided which is operably connected to the valve system 31 and the cleaning system 43. The controller 50 may control the first and second valve 35, 37 during deposition and cleaning. The controller 50 may be provided with a memory 51 and a processor 53. The controller 50 may be provided with a clock, for example as part of the processor 53 to run a recipe as a function of time. A recipe for deposition and/or cleaning may be stored in the memory 51.

The cleaning gas system 43 may be constructed and arranged to provide the cleaning gas 33 mixed with an inert gas received from an inert gas source 45. The inert gas source 45 may provide argon, helium or nitrogen as the inert gas. The cleaning gas system 43 may be constructed and arranged to provide the cleaning gas mixed with argon, helium or nitrogen. The cleaning gas system 43 may be constructed and arranged to provide a cleaning gas comprising at least one halogen selected from the group comprising fluorine, chlorine, bromine and iodine from the cleaning gas source 33. The cleaning gas system 43 may be constructed and arranged to provide the cleaning gas comprising nitrogen trifluoride ($NF_3$) from the cleaning gas source 33.

The cleaning gas system 43 may be constructed and arranged to mix the cleaning gas from the cleaning gas source 33 with inert gas from the inert gas source 45. The cleaning gas may be mixed to a 1 to 20%, preferably 3 to 10% and most preferably about 5% mix in the inert gas by the cleaning gas system 43. The mixing by the cleaning gas system 43 may be controlled by the controller 50 to get the partial pressure of the cleaning gas in a required range. In the required range over etching may not happen. The cleaning gas system 43 may be constructed and arranged to provide the cleaning gas (pure etchant) at a flow rate between 10 to 300, preferably 50 to 200 cubic centimeters per minute (SCCM) to the valve system 31. Since it is mixed with the inert gas this would mean a total flow rate if a 5% concentration of etchant is used of 0.2 to 6, preferably 1 to 4 liters per minute (SLM).

The cleaning gas may be fluorine and mixed to a 1 to 20%, preferably 3 to 10% and most preferably about 5% mix in helium as the inert gas by the cleaning gas system 43.

The chemical vapor deposition furnace may be constructed and arranged to provide the cleaning gas with the cleaning gas system 43 in the interior of the process gas injector 17. The furnace may be constructed to provide the cleaning gas at a partial pressure between 0.01 and 0.5 and most preferably 0.05 Torr in the interior. At this partial pressure the cleaning of the relatively thick layers in the interior of the injector 17 may be accomplished relatively quick.

The chemical vapor deposition furnace may be constructed and arranged to provide the cleaning gas with the cleaning gas system 43 in the process chamber 4 via the process gas injector 17. The gas exhaust opening 8 for removing gas from the process chamber 4 may be operationally connected to a pump. The pump may be connected to the controller 50 to control the pressure in the process chamber 4 to a partial pressure of the cleaning gas to between 0.001 and 0.1 and most preferably around 0.02 Torr. At this partial pressure the cleaning of the relatively thin layers in the process chamber 4 may be accomplished relatively slow to circumvent over etching of the process chamber 4. Over etching may negatively influence the lifetime of the process gas injector 17, process tube 1 or liner 2 since it may roughen the surface. The chemical vapor deposition furnace may be provided with a purge gas injection system 24 constructed and arranged to provide a purge gas 25 into the process chamber 4 near a lower end of the process chamber 4 to lower the particle pressure of the cleaning gas in the process chamber. The purge gas injection system 24 may be connected to the controller 50 to control the partial pressure of the cleaning gas to between 0.001 and 0.1 and most preferably around 0.02 Torr for cleaning of the process chamber 4 while circumventing over etching.

When the interior of the process gas injector 17 is sufficiently cleaned the partial pressure of the cleaning gas may be increased by the controller 50 for cleaning of the process chamber 4.

Optionally, the purge gas injection system 24 may be constructed and arranged to provide cleaning gas to the process chamber 4 near a lower end of the process chamber 4. This may be accomplished additional to the cleaning gas via the process gas injector or as a separate solution. This may help in cleaning the process chamber 4 in time.

The cleaning of the process gas injector 17 and the process chamber 4 may, in an embodiment, be decoupled from one another. This may be accomplished by a two-step cleaning procedure. Thus, the chemical vapor deposition furnace may be constructed and arranged to provide, in a first step, the cleaning gas with the cleaning gas system 43 in the interior of the process gas injector 17 while the inert gas from the inert gas source 45 may directly be provided to the process chamber 4. This may allow for modulating the partial pressure in the process chamber 4. When the cleaning gas exits the interior of the process gas injector 17 via the gas injection holes 23 into the process chamber 4 etching of the films produced by the deposition process also takes place in the process chamber 4. The provision of the inert gas to the process chamber 4 may thus, provide for reducing the partial pressure of the cleaning gas in the process chamber 4. This may lead to reducing the etch rate of the films produced by the deposition process in the process chamber 4. This may advantageously allow for circumventing over etching of the process chamber 4, while cleaning the process gas injector 17 thereby, not jeopardizing the lifetime of the process chamber 4.

This decoupling of the cleaning of the gas injector 17 from that of the process chamber 4 may thus, lead to the cleaning of the gas injector 17 during the first step.

The partial pressure of the cleaning gas in the process gas injector 17, during the first step, may be configured such that the ratio of etch rate of the films produced by the deposition process in the process gas injector 17 over that in the process chamber 4 may be about 2 or more so that cleaning, mainly, of the process gas injector 17 during the first step cleaning is accomplished.

The pump that may be connected to the controller 50 may then adjust the partial pressure of the cleaning gas, during the first step, in the process chamber 4 to be less than 0.2 Torr, while it may adjust the partial pressure of the cleaning gas in the process gas injector 17 to be higher than 0.2 Torr. This may advantageously allow for providing cleaning of the process gas injector 17, during the first step, with higher selectivity compared to the cleaning of the process chamber 4.

In an embodiment, the partial pressure of the cleaning gas in the process gas injector during the first step may be in a range from 0.2 Torr to 0.5 Torr.

The direct provision of the inert gas from the inert gas source 45 to the process chamber 4 during the first step may, in an embodiment, be done through a bottom inlet.

In one embodiment, the direct provision of the inert gas to the process chamber 4 during the first step may done through another process gas injector 17 that may be present in the process chamber 4. This may be the case when multiple process gas injectors are used, each being directed for individual provision of different precursors that may be comprised in the process gas.

After completion of the cleaning of the process gas injector 17, during the first step, the provision of the cleaning gas to the gas injector 17 may be stopped and replaced by a provision of inert gas from the inert gas source 45, during the second step. The cleaning gas may then, only be provided to the process chamber 4, thereby, carrying out the second step of cleaning. This may then allow for cleaning the process chamber 4 being carried out decoupled from the cleaning of the process gas injector 17. Decoupling may allow for cleaning the process gas injector 17 and the process chamber 4 independent from each other thereby, minimizing the risk for over-etching of the process gas injector 17 and/or the process chamber 4.

In an embodiment, the provision of the cleaning gas to the process chamber 4 may be done directly through the bottom inlet. In another embodiment, the provision of the cleaning gas to the process chamber 4 may be done through another process gas injector 17 that may be present in the process chamber 4.

The pump that may be connected to the controller 50 may adjust the partial pressure of the cleaning gas in the process chamber 4, during the second step, to be equal to or higher than 0.2 Torr. This may advantageously allow for providing cleaning of the process chamber 4, while inert gas is being provided to the process gas injector 17.

In an exemplary embodiment for removing silicon nitride according to the two-step cleaning, 5% $F_2$ gas mixed with He may be used as the cleaning gas at 550° C. During the first step, the cleaning gas may be provided to the process gas injector 17 at about 0.3 Torr. During the second step, the cleaning gas may be provided to the process chamber 4 at about 0.2 Torr.

It is to be understood that the partial pressure value of the cleaning gas and the cleaning time required to etch the films produced by the deposition process may be subject to change as the thickness of the films to be cleaned and the percentage of the inert gas in the cleaning gas changes.

The chemical vapor deposition furnace may be provided with a heater 11 to heat the wafers in the wafer boat 6. The chemical vapor deposition furnace may be provided with a temperature measurement system mounted on the flange 3 and extending along an outer surface of the liner 2 towards the top end of the liner to measure a temperature. The temperature measurement system may comprise a beam with a plurality of temperature sensors provided along the length of the beam to measure the temperature at different heights. The heater 11 and the temperature measurement system may be connected to the controller 50 to control the temperature of the process chamber 4 during cleaning and deposition.

The heater 11 may be controlled by the controller 50 to heat the top of the process chamber 4 to a higher temperature than the bottom of the process chamber 4 during the start of the cleaning. First start with heating the top part of the process chamber 4 to 625 degrees Celsius and heating a lower part of the process chamber 4 to below 575 degrees Celsius with the heater 11 while providing the first cleaning gas. This prevents consumption of the cleaning gas in the bottom of the process gas injector 17 and enables etching in the top of the process gas injector 17. Afterwards, the temperature in the center and later on in the bottom of the process chamber 4 may be slowly increased by the heater 11 under control of the controller 50 to increase the etching in the lower part of the process gas injector 17.

The preferred embodiments are particularly applicable to chemistries wherein a chlorine-containing precursor is used in combination with nitrogen precursor such as for example ammonia ($NH_3$). Examples of chlorine-containing precursors are: $TiCl_4$, $SiCl_2H_2$, $HfCl_4$ and $AlCl_3$. It must be understood that the nitrogen precursor may not be nitrogen. The nitrogen precursor may be reactive while the nitrogen may not be reactive.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

The invention claimed is:

1. A chemical vapor deposition furnace for depositing silicon nitride films on a plurality of wafers comprising:
    a process chamber elongated in a substantially vertical direction;
    a wafer boat for supporting the plurality of wafers in the process chamber;
    a process gas injector inside the process chamber extending in the substantially vertical direction along the wafer boat and provided with a plurality of vertically spaced gas injection holes to provide gas introduced at a feed end in an interior of the process gas injector to the process chamber;
    a liner accommodating the process gas injector and extending in the substantially vertical direction to radially surround the wafer boat, the liner including a cover portion covering an end of the wafer boat opposite to the feed end of the process gas injector in the substantially vertical direction;
    a valve system operably connected to the feed end of the process gas injector and being constructed and arranged to connect a source of a silicon precursor and a source of a nitrogen precursor to the feed end of the process gas injector for depositing silicon nitride layers, wherein the valve system is further constructed and arranged to connect the feed end of the process gas injector to a cleaning gas system to provide a cleaning gas to the interior to remove silicon nitride from at least one of the process gas injector and the process chamber;
    a purge system disposed proximate to a lower end of the process chamber entirely below the liner, the purge system configured to provide an inert gas directly into the lower end of the process chamber below the liner; and
    a controller operably connected to the valve system, the cleaning gas system and the purge system to control the purge system to provide a purge gas to dilute the cleaning gas in the process chamber during supply of the cleaning gas and to control the purge system to provide inert gas directly to the process chamber decoupled from inert gas being provided, via vertically spaced injection holes, to the process chamber.

2. The chemical vapor deposition furnace of claim 1, wherein the plurality of gas injection holes of the process gas injector extend over substantially a height of the wafer boat.

3. The chemical vapor deposition furnace of claim 1, wherein the cleaning gas system is connected to a cleaning gas source.

4. The chemical vapor deposition furnace of claim 1, wherein the cleaning gas system is constructed and arranged to provide the cleaning gas mixed with an inert gas.

5. The chemical vapor deposition furnace of claim 4, wherein the cleaning gas system is constructed and arranged to provide the cleaning gas mixed with argon, helium or nitrogen as the inert gas.

6. The chemical vapor deposition furnace of claim 1, wherein the cleaning gas system is constructed and arranged to provide the cleaning gas comprising at least one halogen selected from the group comprising fluorine, chlorine, bromine and iodine.

7. The chemical vapor deposition furnace of claim 1, wherein the cleaning gas system is constructed and arranged to provide the cleaning gas comprising nitrogen trifluoride $NF_3$.

8. The chemical vapor deposition furnace of claim 1, wherein the cleaning gas system is constructed and arranged to provide the cleaning gas comprising fluorine $F_2$.

9. The chemical vapor deposition furnace of claim 4, wherein the cleaning gas system is constructed and arranged to provide the cleaning gas in a 1 to 20% mixture with helium as the inert gas.

10. The chemical vapor deposition furnace of claim 1, wherein the cleaning gas system is constructed and arranged to provide the cleaning gas at a flow rate between 10 to 300 cubic centimeters per minute (SCCM).

11. The chemical vapor deposition furnace of claim 1, wherein the deposition furnace is constructed and arranged to provide the cleaning gas with the cleaning gas system at a partial pressure between 0.01 and 0.5 Torr in the interior of the process gas injector.

12. The chemical vapor deposition furnace of claim 1, wherein the deposition furnace is constructed and arranged to provide the cleaning gas with the cleaning gas system at a partial pressure between 0.001 and 0.1 Torr in the process chamber.

13. The chemical vapor deposition furnace of claim 1, wherein the purge system is disposed below the wafer boat and configured to provide the inert gas directly into the lower end of the process chamber below the wafer boat.

14. The chemical vapor deposition furnace of claim 1, further comprising:
a heater to heat the process chamber,
wherein the controller is operably connected to the valve system, the cleaning gas system, purge system, and the heater to control the heater to heat the process chamber during cleaning.

15. The chemical vapor deposition furnace of claim 14, wherein the heater is constructed and arranged to create a temperature difference over the process chamber in the substantially vertical direction and the controller controls the heater to provide a higher temperature in the top of the process chamber compared to the bottom of the process chamber during cleaning.

16. The chemical vapor deposition furnace of claim 1, further comprising:
a pump to remove gas from the process chamber,
wherein the controller is operably connected to the valve system, the cleaning gas system, the purge system, and the pump to control the pump to remove gas from the process chamber during cleaning.

17. The chemical vapor deposition furnace of claim 1, wherein the covering portion is dome shaped.

18. The chemical vapor deposition furnace of claim 1, further comprising:
a gas exhaust opening disposed at the lower end of the process chamber below the feed end of the process gas injector, the gas exhaust opening configured to allow gas to flow outward from the process chamber.

19. The chemical vapor deposition furnace of claim 18, further comprising:
a purge line configured to provide a purge gas to the process chamber, wherein the purge line is closer to the wafer boat and further from the lower end of the process chamber than the gas exhaust opening.

* * * * *